United States Patent [19]
Konishi

[11] Patent Number: 6,001,739
[45] Date of Patent: Dec. 14, 1999

[54] METHOD OF MANUFACTURING A SEMICONDUCTOR DEVICE

[75] Inventor: Nobuo Konishi, Yamanashi-ken, Japan

[73] Assignee: Tokyo Electron Limited, Tokyo, Japan

[21] Appl. No.: 08/979,658

[22] Filed: Nov. 26, 1997

[30] Foreign Application Priority Data

Nov. 27, 1996 [JP] Japan .................................. 8-332814

[51] Int. Cl.⁶ .................................................. H01L 21/00
[52] U.S. Cl. ........................... 438/692; 216/49; 438/725; 438/705
[58] Field of Search .................. 216/49, 62, 87; 438/725, 692, 705

[56] References Cited

U.S. PATENT DOCUMENTS

| | | | |
|---|---|---|---|
| 4,751,170 | 6/1988 | Mimura et al. | 216/62 X |
| 4,808,511 | 2/1989 | Holmes | 216/62 X |
| 5,322,764 | 6/1994 | Kamiyama et al. | 216/49 X |

OTHER PUBLICATIONS

David Cheung, "Dielectric CVD Films for Advanced Lithography Applications", Applied Materials, Inc.; SEMICON Japan, Dec. 1996., pp. 1–18.

*Primary Examiner*—William Powell
*Attorney, Agent, or Firm*—Oblon, Spivak, McClelland, Maier & Neustadt, P.C.

[57] ABSTRACT

A method of manufacturing a semiconductor device comprising the steps of forming an organic insulating film of a low dielectric constant on a surface of a silicon wafer, forming a photoresist film on the organic insulating film, exposing the photoresist film to light to form a pattern, reacting a silicon containing compound with the photoresist film pattern-exposed to silylate a light exposed portion of the photoresist film, thereby making etching resistance of the light-exposed portion higher than a non-light-exposed portion of the photoresist film, and performing reactive ion etching using a silylated photoresist film as a mask, thereby dry-developing the non light-exposed portion of the photoresist film simultaneously with etching the organic insulating film.

16 Claims, 6 Drawing Sheets

METHOD OF MANUFACTURING A SEMICONDUCTOR DEVICE

BACKGROUND OF THE INVENTION

The present invention relates to a method of manufacturing a semiconductor device such as a MOS (Metal Oxide Semiconductor).

Figure 1A:
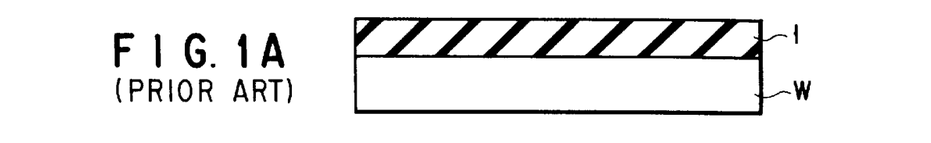
FIGS. 1A to 1G constitute a flow chart of the conventional method of manufacturing semiconductor device.
Figure 1B:
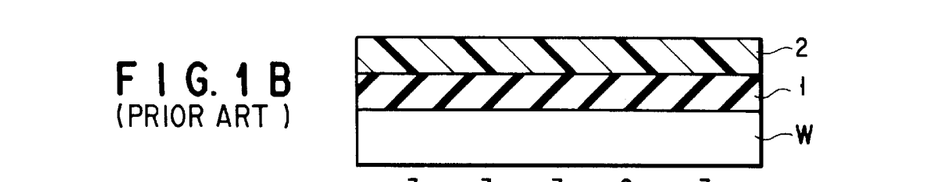
Figure 1C:
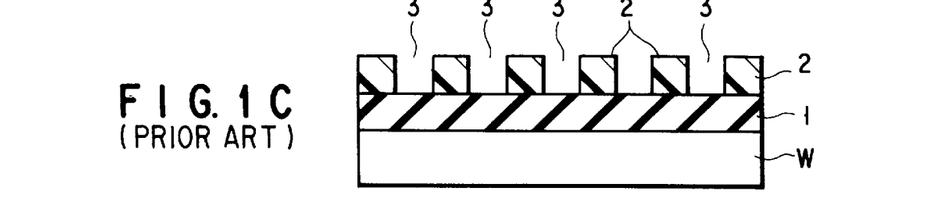
Figure 1D:
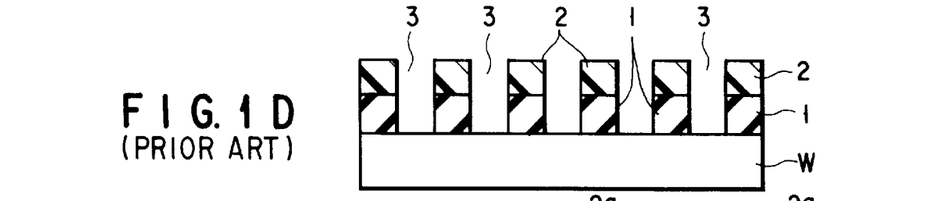
Figure 1E:
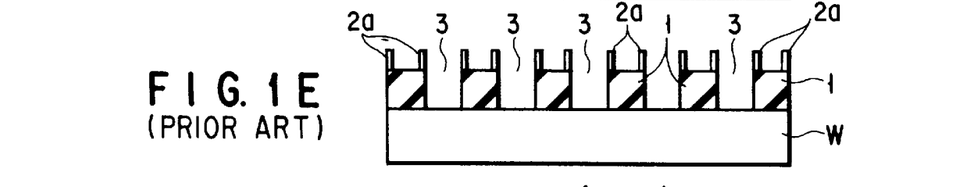
Figure 1F:
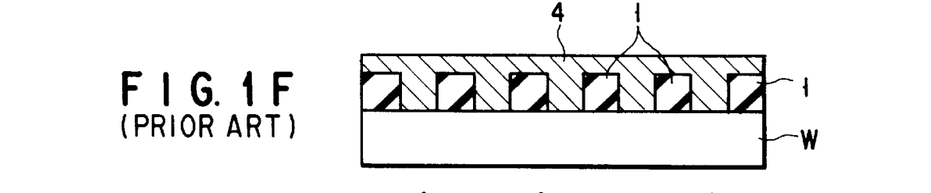
Figure 1G:
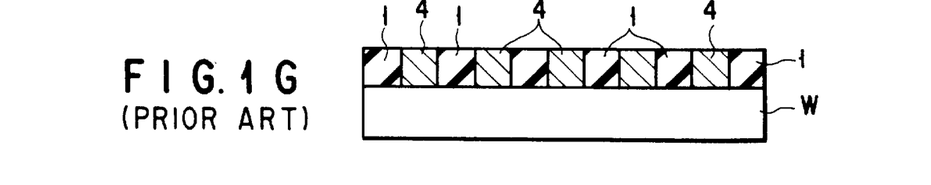

In a manufacturing method of a semiconductor device such as a MOS, photolithographic technology has been widely employed. In the photolithographic technology, an insulating film 1 is first formed on a surface of the silicon wafer W, as shown in FIG. 1A. A photoresist film 2 is then formed on the insulating film 1 as shown in FIG. 1B. The photoresist film 2 is exposed to light and developed to form a pattern on the resist film 2, as shown in FIG. 1C. Using the patterned resist film 2 as a mask, the insulation film 1 is selectively etched as shown in FIG. 1D, followed by removal of the photoresist film 2 as shown in FIG. 1E. Then, as shown in FIG. 1F, the pattern formation surface of the wafer W is covered with a wiring layer 3. Subsequently, an unnecessary portion of the wiring layer 3 is removed from the surface by chemical mechanical polishing. In this manner, a predetermined circuit pattern is formed.

To etch the insulating film 1 accurately and faithfully to a predetermined pattern in the step of FIG. 1D, it is important for the photoresist film 2 left on the wafer W to have a sufficient thickness to serve as a masking material. If the photoresist film 2 is not sufficiently thick, the resist film 2 is partially etched away together with the insulating film during etching. As a result, the contrast of the resist pattern decreases and the masking function thereof degrades. Therefore, the photoresist film 2 is formed on the insulating film 1 in a thickness of at least 100 to 150 nm (1.0 to 1.5 $\mu$m) in the step shown in FIG. 1B of a conventional method.

On the other hand, according to a circuit design standard for a semiconductor device in recent years, a wiring width required for 16M-DRAM falls 50 to 60 nm (0.5 to 0.6 $\mu$m) and the wiring width required for 64M-DRAM is 35 nm (0.35 $\mu$m). To attain such an ultra-fine micro patterning, an even higher resolution level is required during light-exposure, with the result that the focus margin of a light exposure device has become very narrow. Under this circumstance, it has been difficult to bring the photoresist film 2 of 100 to 150 nm thick into focus of a light exposure device. Accordingly, a highly accurate ultra-fine micro pattern formation is not attained. It is therefore useful to reduce the thickness of the photoresist film 2 as much as possible to form such an ultra-fine micro pattern. However, if the photoresist film 2 is formed excessively thin, not only the insulating film 1 but also the photoresist film 2 is etched away during etching. The resultant resist pattern decreases in contrast, failing in masking function.

Recently, a chemically amplified resist has been widely used since it can compensate shortage in brightness. However, the chemically amplified resist has a disadvantage in that light permeability is slightly lower than a novolac series resin generally used. Therefore, if the chemically amplified resist film is formed thick, it takes a long time to complete the light-exposure process. The light exposure process must be carried out in a short time to increase the throughput. In consideration of throughput, it is desired that the chemically amplified resist film be formed as thin as possible.

In addition, in the conventionally employed process, a photoresist film 2 must be removed in the step of FIG. 1E before the step shown in FIG. 1F. This is because when the contact hole 3 is formed through the insulating film 1 with the photoresist film 2 left thereon, the depth of the contact hole 3 is deeper than required, with the result that the wiring layer 4 may not smoothly reach a bare silicon surface of the wafer W. For this reason, it has been desired that the resist film be formed even thinner.

On the other hand, the photoresist film 2 forming the side wall of the contact hole 3 shown in FIG. 1D is influenced by a polymer attached thereon and sometimes behaves like a hard material on appearance. As a result, after the photoresist film 2 is removed, a side wall portion 2a remains in the form of a fence as shown in FIG. 1E. Therefore, a step of removing the fence-form side wall portion 2a must be added after the step shown in FIG. 1E. Since a process step is added, the throughput decreases. In addition, care must be taken to dispose of an organic solvent used in removing the fence-form side wall portion so as not to have adverse effects on other agents and the wafer.

BRIEF SUMMARY OF THE INVENTION

An object of the present invention is to provide a method of manufacturing a semiconductor device, capable of forming an ultra-fine micro pattern in a short light-exposure time and forming a thin photoresist film contributing to quick and easy removal.

The method of manufacturing a semiconductor device according to the present invention comprises the steps of:

(A) forming an organic insulating film on a surface of a silicon wafer;

(B) forming a photoresist film on the organic insulating film;

(C) performing pattern exposure of the photoresist film;

(D) reacting a silicon-containing chemical compound with the pattern-exposed photoresist film to silylate the light-exposed portion of the photoresist film, thereby making etching resistance thereof higher than that of the non light-exposed portion of the photoresist film; and (E) performing reactive ion etching using a silylated photoresist film as a mask, thereby dry-developing the non-light-exposed portion of the photoresist film simultaneously with etching the organic insulating film.

The organic insulating film used herein is formed by use of a Chemical Vapor Deposition device or a spin coater and formed of a silicon-containing organic compound represented by $(CH_x—SiO_y)_n$, x=2 or 3, y=2 or 3.

The photoresist film is preferably formed of a phenol series resin containing no silicon component. More specifically, the photoresist film is formed of an anisotropic phenol-series cresol novolac resin.

The silicon-containing compound (organic silicon compound) used as a silylating agent has a hydrolysis group generating an active silanol group by hydrolysis, and a reactive organic group reactive to an amino group, a carboxyl group, and an alkoxycarbonyl group. More specifically, the silicon-containing compound includes hexamethyldisilazane (HMDS), tetramethyldisilazane, silane, disilane, dichlorsilane, silane trichloride, silicon tetrachloride, silicon tetrafluoride, 3-aminopropyltriethoxysilane, glycidylpropyltrimethoxysilane, 3-isocyanatepropyltriethoxysilane, p-trimethoxysilylaniline, 4-triethoxysilylbuthanoic acid, ethyl-4-triethoxysilylbuthanoate, p-triethoxysilylbezoic acid, p-triethoxysilylbenzoate and partially condensed products obtained by hydrolysis and polycondensation of the aforementioned compounds.

To improve the hardness, water-resistance, heat-resistance and mechanical strength of the silylated compound, it is preferable that the organic silicon compound contain an organic metal compound. The organic metal compound has an organic group selected from the group consisting of methyl, ethyl, propyl, chloropropyl, vinyl, trifluoropropyl, glycidoxypropyl, methacryloxypropyl, mercaptopropyl, phenyl, epoxycyclohexylethyl, aminopropyl, 3-isocyanatepropyl and the like, and at least one metal element selected from the group consisting of compounds belonging to the 3A group to the 8A group of the periodic table, which include scandium, yttrium, lanthanum, titanium, zirconium, hafnium, vanadium, niobium, tantalum, chromium, molybdenum, tungsten, manganese, iron, cobalt, and nickel; and compounds belonging to the 1B group to the 6B group which include copper, zinc, cadmium, mercury, aluminium, gallium, thallium, silicon, germanium, tin, lead, arsenic, antimony, bismuth, selenium, and tellurium.

The method of manufacturing a semiconductor device according to the present invention comprises:

(a) forming an insulating film on a surface of a silicon wafer;

(b) forming a photoresist film on the insulating film;

(c) exposing the photoresist film to light to form a pattern;

(d) wet-developing the pattern-exposed photoresist film;

(e) introducing (doping) a dopant into the photoresist film to improve the etching resistance of the photoresist film; and (f) etching the insulating film by reactive ion etching using the photoresist film improved in etching resistance as a mask.

In the step (a), the insulating film such as an $SiO_2$ film or an SiN film, is formed by use of a thermal oxidation device or a CVD film-formation device.

In the step (b), the photoresist film is coated on the insulating film by applying a photoresist solution while the wafer is being rotated by use of a spin coater. The film thickness of the photoresist film formed in the step (b) is preferably 30 nm or less, and more preferably 20 nm or less. However, if the photoresist film is excessively thin, the masking function of the film degrades. Therefore, the lowermost film thickness is defined as 10 nm. The photoresist film formed in the step (b) includes a novolac series resin and a chemically amplified resin.

There is the following relationship between the resist film thickness t1 and the lowermost value ($L_{min}$) of pattern wiring width. When the film thickness t1 is 0.3 $\mu$m (30 nm), the lowermost value $L_{min}$ is 0.15 $\mu$m (15 nm). When t1 is 0.2 $\mu$m (20 nm), $L_{min}$ is 0.1 $\mu$m (10 nm). When t1 is 0.1 $\mu$m (10 nm), $L_{min}$ is 0.08 $\mu$m (8 nm).

In the step (e), a dopant such as P or As is implanted in the photoresist film by an ion implanter. The step (e) may be performed at any time, as long as it is performed between the photoresist forming step (b) and the etching step (f).

Furthermore, after a wiring layer is formed on the pattern-etched photoresist film and the insulating film, the resist film may be removed together with an unnecessary portion of the wiring layer by chemical mechanical polishing. In other words, the photoresist film may be removed when the surface of the substrate is polished instead of being removed before the wiring layer is formed on the surface of the substrate.

According to the present invention, since the etching resistance of the photoresist film is improved before etching is performed, even if the thickness of the photoresist film is reduced, the photoresist film will not be scraped during etching. As a result, etching can be made accurately and faithfully to a predetermined pattern.

Furthermore, even though a focus margin of the light-exposure device is narrow, light exposure of the resist can be accurately performed by reducing the thickness of the photoresist film. As a result, a highly precise patterning is attained. Since the photoresist film is thin, even though a chemically amplified resist film is used, the resist film can be patterned in a short light-exposure time, resulting in an improvement of the throughput.

Furthermore, since the photoresist film can be reduced in thickness, even though the photoresist film remains on the insulating film, the wiring layer formed can easily reach the base silicon surface. As a result, the photoresist-film removal step is not required before the wiring layer formation step, and therefore, the throughput is improved.

It should be noted that if the resist film is thin, the resist film may be not be removed from the surface of the substrate and may remain as it is. If the patterned photoresist film is removed, the resist film may be removed together with a silylated layer by use of chemical mechanical polishing. Furthermore, the patterned photoresist film may be left on the wafer without being removed.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinbelow, preferred embodiments of the present invention will be explained with reference to the accompanying drawings.

A first embodiment of the present invention will be explained with reference to FIGS. 2A to 2I and 3.

Figure 2A:
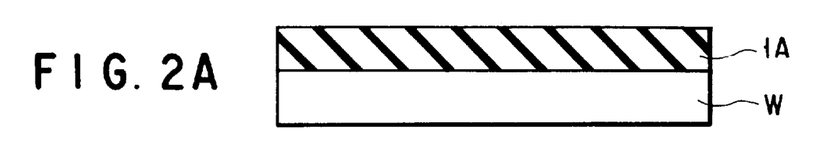
FIGS. 2A to 2I constitute a flow chart showing a method of manufacturing the semiconductor device according to a first embodiment of the present invention.

Using Chemical Vapor Deposition method or spin coating method, an organic insulating film 1A of $(CH_3—SiO_2)_n$ is formed on the surface of the wafer W (Step S1), as shown in FIG. 2A. The wafer W used herein is a bare silicon wafer of 8-inch diameter.

Figure 2B:
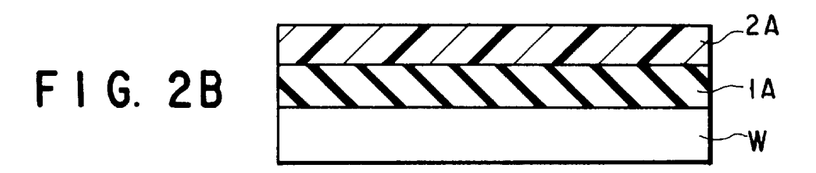

The wafer W is loaded in the spin coater to form a photoresist film 2A on the organic insulating film 1A, as shown in FIG. 2B (Step S2). The photoresist film 2A is made of a phenol-series cresol novolac resin. The film thickness t1 of the photoresist film 2A is set to fall within the range of 20 to 30 nm. The film thickness t1 is preferably 30 nm or less and more preferably 20 nm or less.

Subsequently, the wafer W is loaded in a baking device to heat the water W to a predetermined temperature. In this way, the photoresist film 2A is dried.

Figure 2C:
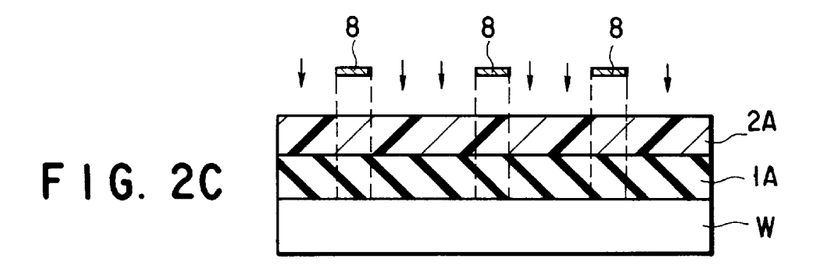

The wafer W is loaded in a light-exposure device. The photoresist film 2A is exposed using a mask 8 to make a pattern, as shown in FIG. 2C (Step S3). In this embodiment, since the film thickness of the resist film 2A is reduced, accurate patterning can be made even if a focus margin of the light-exposure device is narrow. In addition, since the thickness t1 of the photoresist film is reduced, the light-exposure process can be completed in a short time even though the chemically amplified resist film 2A is used.

Figure 2D:
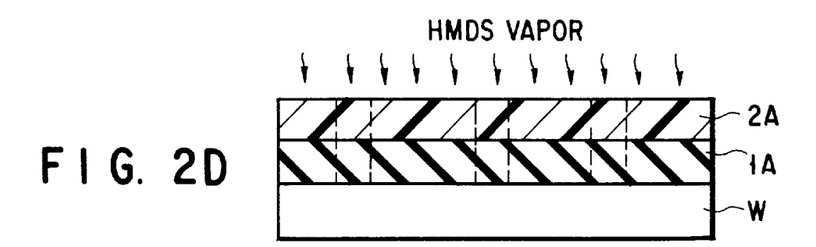
Figure 2E:
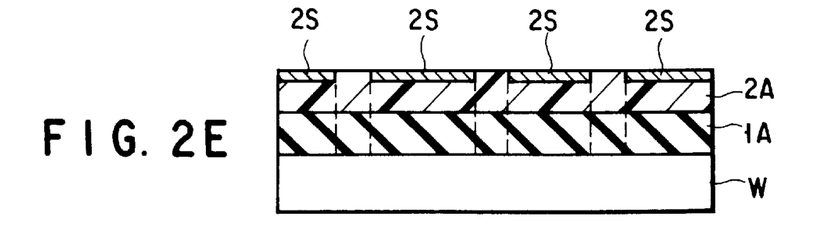
Figure 2F:
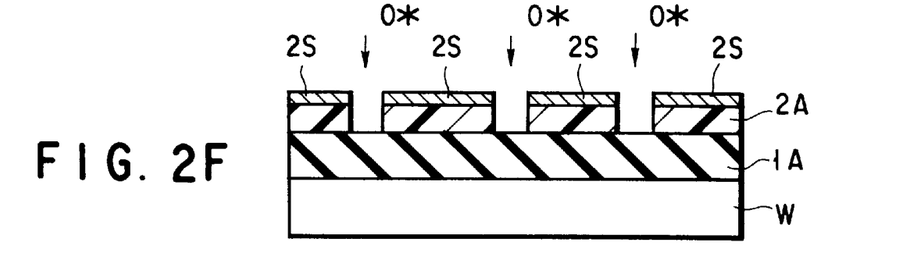
Figure 2G:
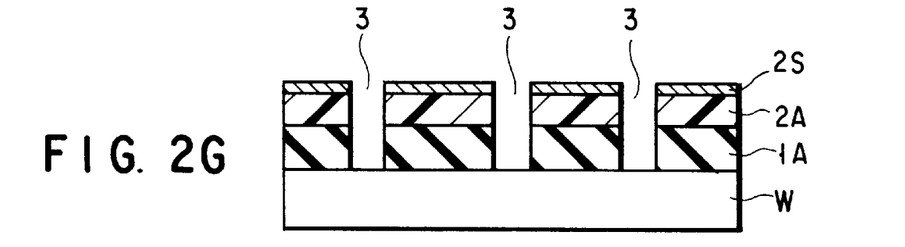
Figure 3:
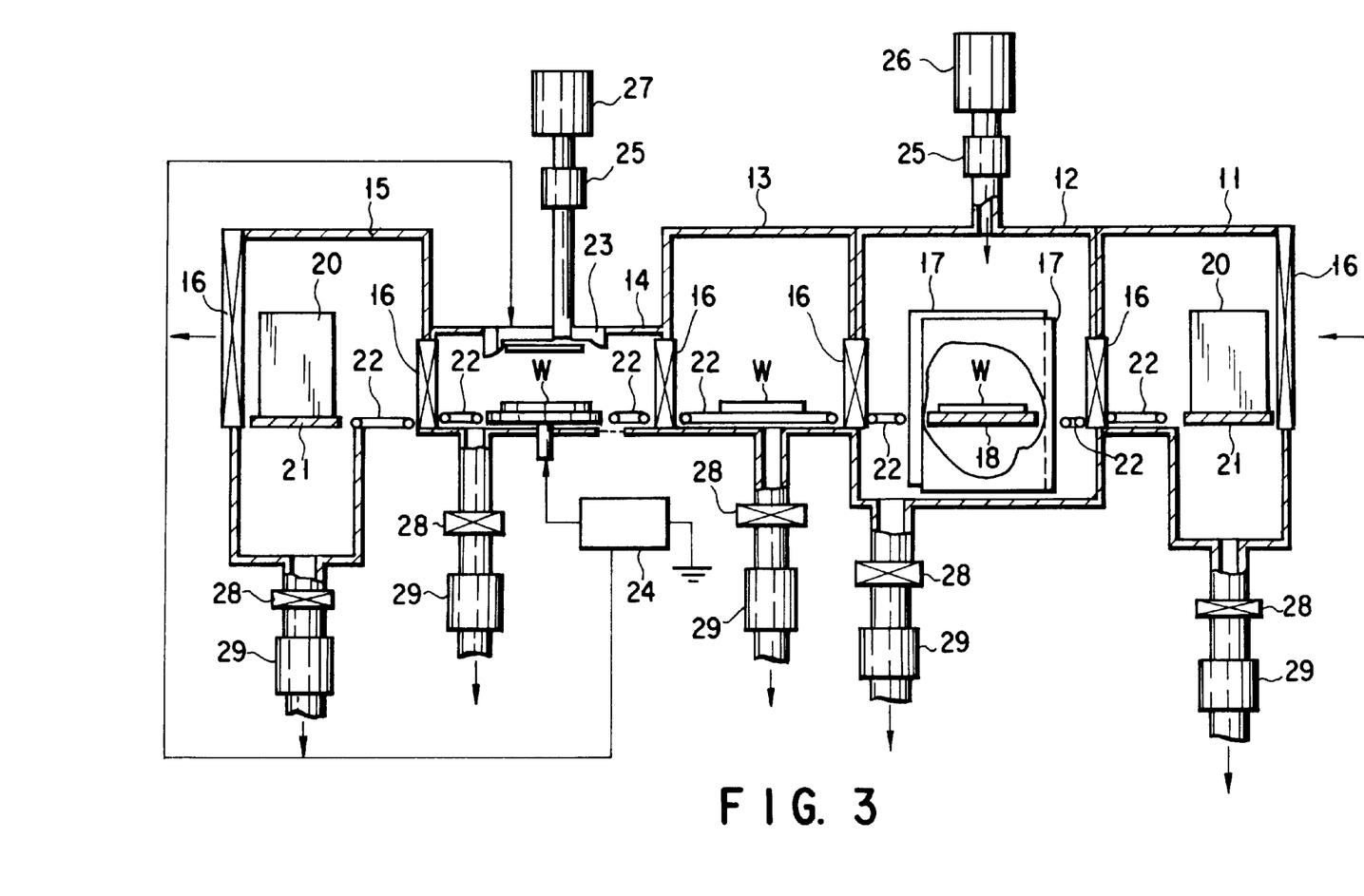
FIG. 3 is a schematic view showing the structure of an apparatus employed in the method of manufacturing a semiconductor device according to the first embodiment of the present invention.

The wafer W is then loaded in the process system shown in FIG. 3. The photoresist film 2A of the wafer W is silylated as shown in FIGS. 2D and 2E (Step S4). Afterward, the photoresist film 2A and the organic insulating film 1A are dry-developed as shown in FIGS. 2F and 2G (Step S5).

Now, the process system will be explained with reference to FIG. 3. The process system has a first preparatory evacuation chamber 11, a silylation process chamber 12, a preparatory evacuation chamber 13, a dry-development chamber 14, and a second preparatory evacuation chamber 15. Individual chambers (11, 12, 13, 14, 15) are connected in line via a gate bulb 16. The wafer W is loaded in the first preparatory evacuation chamber 11 from the outside of the system, passes through individual chambers (12, 13, 14) in the order mentioned, and unloaded out of the system from the second preparatory evacuation chamber 15.

The silylation process chamber 12 houses a wafer mounting table 18. The wafer mounting table 18 has a built-in heater for heating the wafer W mounted on the table 18. To the silylation process chamber 12, an HMDS vapor supply source 26 is connected via a mass-flow controller 25. Through the mass-flow controller 25, the HMDS (hexamethyldisilazane) vapor is supplied into the silylation process chamber 12. The silylation process chamber 12 is connected to a suction port of a vacuum pump 29 via the control valve 28. The dry developing chamber 14 has a susceptor electrode connected to an RIE power source 24 and a gas shower electrode 23. The suction port of the vacuum pump 29 is connected to the individual chambers (11, 12, 13, 14, 15) via the control valves 28 to evacuate the chambers.

After the wafer W is loaded in the silylation process chamber 12, the HMDS vapor (silicon containing gas) is supplied into the process chamber 12. The HMDS vapor is reacted with a light-exposed portion of the photoresist film 2A to form a thin silylated layer 2S as shown in FIG. 2E (Step S4). The etching resistance of the silylated layer 2S becomes higher than that of the non-light-exposed portion of the photoresist film 2A. An HMDS solution is heated to about 75° C. to produce the HMDS vapor. The HMDS vapor may be introduced in the process chamber 12 to process the photoresist film 2A at a pressure of 760 Torr and a temperature of 160° C. for about 3 minutes.

The wafer W is then loaded into the dry developing chamber 14 and then an oxygen gas plasma is generated. Oxygen radicals generated from the oxygen gas plasma thus obtained are allowed to react with a photoresist film of the wafer. In this manner, the photoresist film 2A is dry-developed using the silylated layer 2S as a mask (Step S5), and subsequently, the organic insulating film 1A is dry-etched (Step S6). As a result, the non-light-exposed portion of the photo-resist film 2A is removed as shown in FIG. 2F to form a depressed portion 3a in a predetermined pattern. Then, the organic insulation film 1A is partially removed to form a contact hole 3 of a predetermined pattern, as shown in FIG. 2G.

Figure 2H:
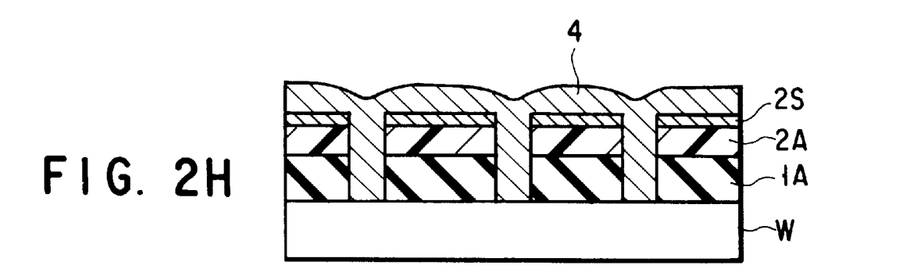

After the dry development is completed, the wafer W is transferred from the process system to a CVD device (not shown). Then, a wiring material is supplied onto the surface of the wafer W under predetermined conditions to form a wiring layer 4 as shown in FIG. 2H (Step S7). In the wiring layer formation step S7, the water W is loaded in the vacuum chamber and a metal aluminum vapor is introduced in the chamber to deposit the metal aluminum onto the wafer surface.

In the step S7, the wiring layer 4 can be formed without removing the photoresist film 2A in advance. More specifically, since the thickness t1 of the photoresist film 2A is drastically reduced compared to the conventionally-used film, the depth of the contact hole to the bare wafer surface is not significantly deep. Therefore, the wiring material can smoothly reach the bare wafer surface. As mentioned above, the step of removing the photoresist film 2A can be omitted. As a result, the throughput is improved.

Figure 2I:
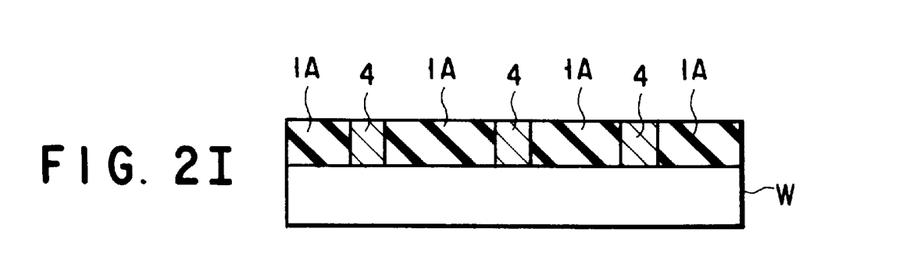

Finally, as shown in FIG. 2I, the surface of the wafer W is polished to remove unnecessary wiring layer 4 (Step S8).

In the polishing step 8, it is preferred to employ, for example, CMP (chemical mechanical polishing). As a method for removing the wiring layer 4. In the polishing step 8, it is preferred to employ, for example, CMP (chemical mechanical polishing). As a method for removing the wiring layer 4, etching (etching-back) has been conventionally used. However, it is difficult to terminate the etching reaction immediately, and the insulating film 1 is simultaneously polished, causing over-etching. In contrast, the polishing by CMP can be controlled easier than etching, with the result that the etching can be terminated at the surface of the insulating film 1, as shown in FIG. 2I.

Furthermore, in the polishing step S8, the photoresist film 2 can be removed simultaneously with the wiring layer 4. When the film thickness t1 of the photoresist film 2 is excessively thin, the photoresist film 2 can be left on the wafer W as it is without being removed.

Now, a manufacturing method employing a wet development method will be explained as a second embodiment, with reference to FIGS. 4A to 4H, 5 and 6.

Figure 4A:
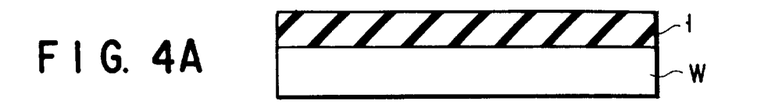
FIGS. 4A to 4H constitute a flow chart of the method of manufacturing a semiconductor device according to a second embodiment of the present invention.

A wafer W is introduced in a thermal oxidation film formation device to form a silicon oxide ($SiO_2$) film 1 serving as an insulating film on the surface of the wafer W as shown in FIG. 4A, (Step S21). The wafer W used herein is a bare silicon wafer of 8-inch diameter.

Figure 4B:
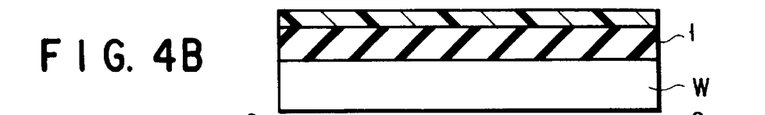
Figure 6:
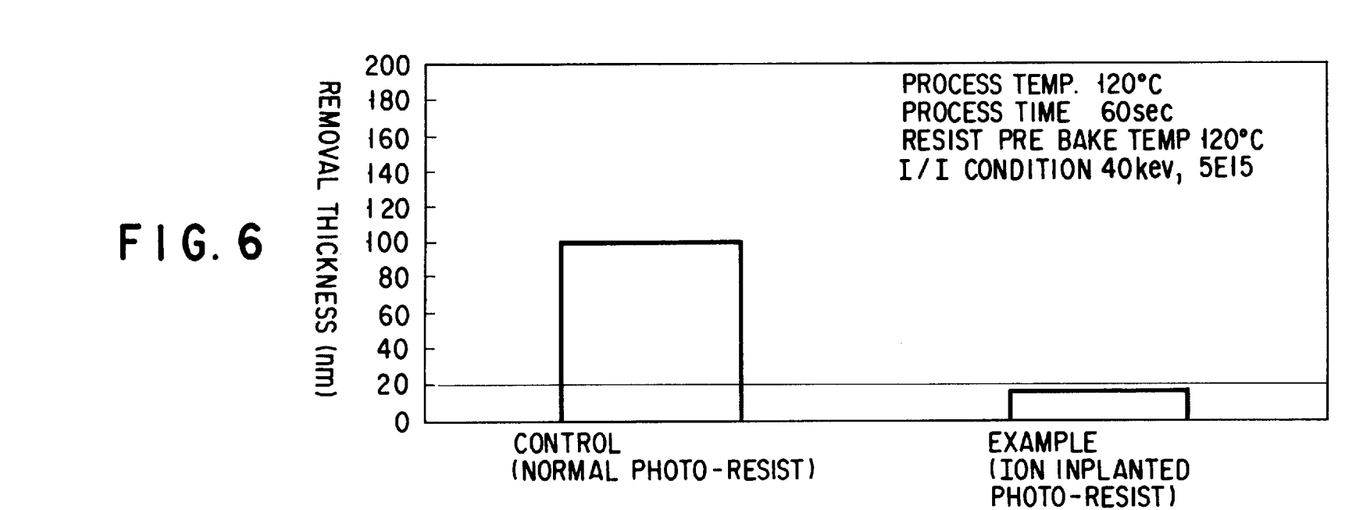
FIG. 6 is a graph showing an etching rate of the resist whose etching resistant properties are enhanced by the method of the second embodiment, by comparison with a conventionally-used resist.

Then, the wafer W is loaded in a spin coater to form a photoresist film 2 on the insulating film 1 as shown in FIG. 4B, (Step S22). The photoresist film 2 is formed so that a film thickness t1 falls within the range of 20 to 30 nm, as shown in FIG. 6. The film thickness t1 of the photoresist film 2 is preferably 30 nm or less and more preferably 20 nm or less. However, if the photoresist film is excessively thin, the masking function degrades. Hence, the lowermost film thickness t1 is set at 10 nm. To form such a thin photoresist film 2, the rotation speed of the spin coater may be increased or the viscosity of a resist solution may be reduced.

Thereafter, the wafer W is loaded in a baking device to heat the wafer W to a predetermined temperature. In this way, the coated resist is dried.

Figure 4C:
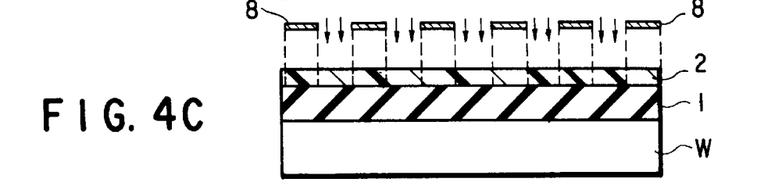

As shown in FIG. 4C, the wafer W is loaded in a light-exposure device. The photoresist film 2 is exposed to light by use of a mask 8 (reticle) to form a pattern (Step 23). In this Embodiment, since film thickness of the photoresist film 2 is reduced, even though a focus margin of the light exposure device is narrow, pattern exposure can be made accurately. Furthermore, since the resist film is formed thin, even though a chemically amplified resist film is employed as the resist film 2, light exposure process can be completed in a short time.

Figure 4D:
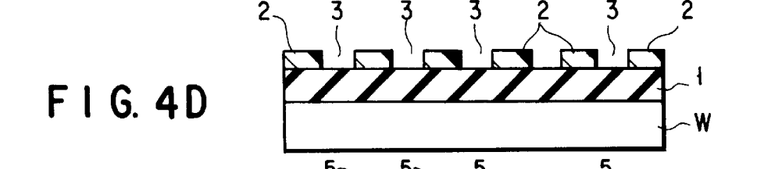

Thereafter, the wafer W is loaded in a developing device (not shown) to develop the photoresist film 2 with the developing solution. As the developing device, for example, the device disclosed in U.S. Pat. No. 5,625,433 is used. Non-light-exposed portion of the photoresist film 2 is then removed, as shown in FIG. 4D, thereby forming a predetermined pattern having a depressed portion 3 (step S24).

After development, the wafer W is loaded in a baking device. The wafer W is heated to a predetermined temperature under predetermined conditions to dry the photoresist film 2 (Step S25). In this embodiment, since the film thickness t1 of the photoresist film 2 is lower than that of the conventional film shown in FIG. 1, the process times required for development and heating are shortened, contributing throughput improvement.

Figure 4E:
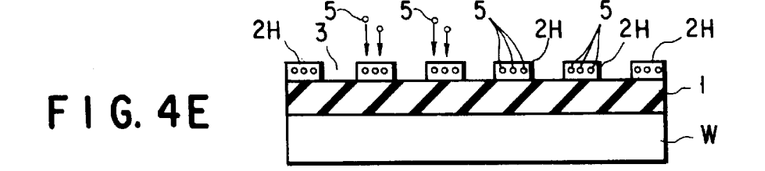

Next, the wafer W is loaded in an ion implanter to implant a dopant 5 such as P or As into the patterned photoresist film 2, as shown in FIG. 4E (Step S26). As the Ion Implantation apparatus, for example, the ion implanters disclosed in U.S. Pat. Nos. 5,397,956 and 5,539,247 may be used.

Figure 5:
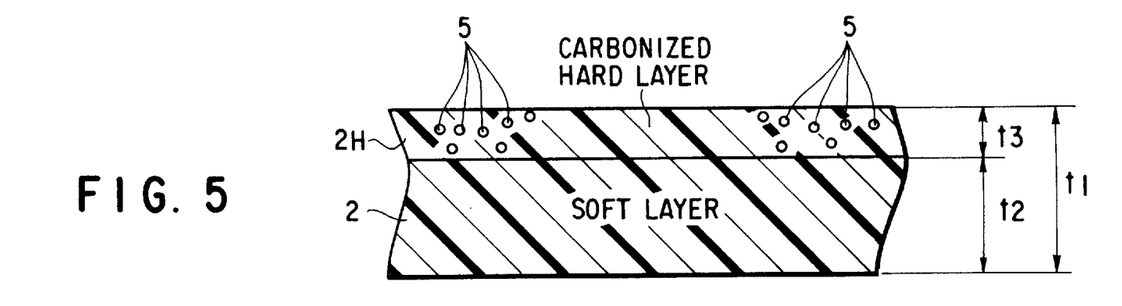
FIG. 5 is a schematic cross-sectional view of a resist layer whose etching-resistant properties are enhanced by the method according to the second embodiment.

When the dopant 5 is implanted in the photoresist film 2, it converts a carbohydrate contained in the photoresist film 2 into a carbide, at the same time, dispersed in the photoresist film 2 to cause distortion in the peripheral portion. As a result, the dopant-implanted region of the photoresist 2 is cured. In this way, a cured carbide portion 2H is formed on the surface layer portion of the photoresist film 2, as shown in FIG. 5. Note that the thickness t3 of the cured carbide portion 2H preferably falls 20 to 50% of the resist film thickness t1. Such the hard layer 2H has a higher etching resistance than a soft resist layer 2.

It is desirable that the thickness of the soft photoresist film 2 uncured be as thin as possible. In stead of the ion implantation, curing of the photo-resist film 2H may be performed by allowing a component of the photoresist film 2 to react with a chemical agent. As a result of curing, the etching resistance is improved.

FIG. 6 is a graph showing the oxygen-plasma etching amount of the photoresist film having a cured surface layer 2H according to the present invention by comparison with that of the conventionally-used photoresist film (comparable embodiment). The etching was carried out at a temperature of 120° C. for 60 seconds. The resist film was pre-baked at 120° C. The ion implantation was carried out under the condition of 40 keV and 5E15.

As is apparent from this figure, the photoresist film of the comparable embodiment is removed in a thickness of 100 to 102 nm during 60-second oxygen-plasma etching, whereas the photoresist film having a cured surface layer portion 2H of the present invention is removed only in a thickness of 16 to 18 nm under the same conditions. As shown above, since the ion-implanted photoresist film 2H has very high etching resistant properties, the entire thickness of the photoresist film can be reduced.

Figure 4F:
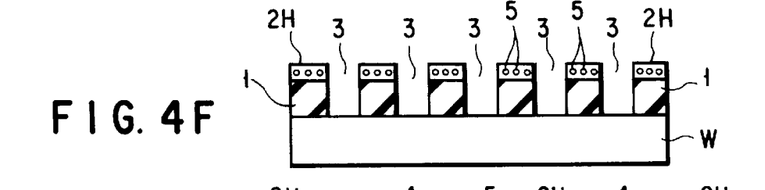

Thereafter, the wafer W is loaded in a dry etching device having plate electrodes arranged in parallel. The oxygen gas plasma is generated between the electrodes, thereby applying a reactive ion etching due to oxygen radicals onto the insulating film 1. At this time, since the patterned photoresist film 2 acts as a masking material, the insulating film 1 can be selectively etched in accordance with the pattern, as shown in FIG. 4F. Consequently, contact holes 3 are formed (Step S27).

In the etching step S27, since the etching resistance of the surface layer portion H of the photoresist film is enhanced, the photoresist film 2 maintains a predetermined pattern without being scraped or distorted, even though the film is thin. Accurate etching is attained faithfully to the pattern.

Figure 4G:
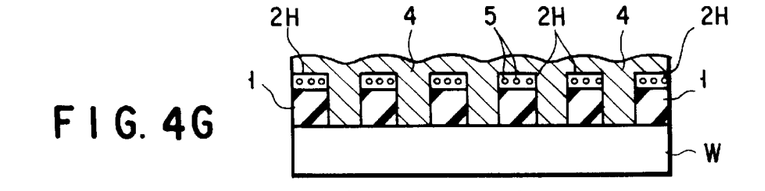

Subsequently, a wiring material is supplied onto the surface of the wafer W to form a wiring layer 4 as shown in FIG. 4G (Step S28). In the wiring layer formation step S28, for example, wafer W is first loaded in a vacuum chamber. Then, a metal aluminium vapor is introduced in the chamber to deposit metal aluminum on the wafer surface.

As described above, the wiring layer 4 can be formed with the photoresist film 2 unremoved, in the step S28. More specifically, since the thickness t1 of the photoresist film 2 is drastically reduced compared to the conventional resist film, the depth to the bare wafer surface is not significantly deep even though the photoresist film 2 remains. Hence, the wiring material can be reach the bare wafer surface, smoothly. As described, the step of removing the photoresist film 2 can be omitted, resulting in an improvement of the throughput.

Figure 4H:
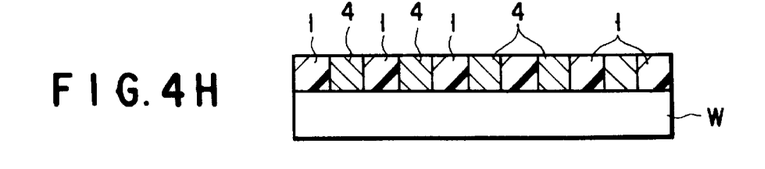

Finally, as shown in FIG. 4H, the surface of the wafer W is polished to remove an unnecessary wiring layer 4 (Step S29). It is desirable that CMP (chemical mechanical polishing) be employed in this polishing step S29. As the method of removing the wiring layer 4, etching (etching-back) has been conventionally used. However, it is difficult to terminate the etching reaction immediately, and the insulating film 1 is simultaneously polished, causing overetching. In contrast, the polishing by CMP can be controlled easier than etching, with the result that the etching can be terminated at the surface of the insulating film 1, as shown in FIG. 4H. Therefore, CMP is advantageous since proper polishing can be made.

Furthermore, in the step S29, the wiring layer 4 can be removed simultaneously with the photoresist film 2. When the film thickness t1 of the photoresist film 2 is sufficiently thin, the photoresist film 2 can be left on the wafer W without being removed.

According to the present invention, the thickness of the photoresist film can be reduced compared to the conventional film thickness by enhancing the etching resistance of the surface layer portion of the photoresist film. By virtue of this, an ultra-micro pattern can be formed with a high throughput without degrading the masking function of the photoresist film. In particular, the present invention makes it possible to expose the chemically amplified photoresist film to light in a short time, with the result that the throughput can be improved.

Furthermore, the present invention makes it possible to reduce the thickness of the photoresist film, so that the wiring material can be supplied to the bare wafer surface smoothly even though the photoresist remains. As a result, the manufacturing steps of a semiconductor device is successfully reduced, compared to the conventional manufacturing steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A method of manufacturing a semiconductor device, comprising the steps of:

(A) forming an organic insulating film on a surface of a silicon wafer;

(B) forming a photoresist film on the organic insulating film;

(C) exposing the photoresist film to light to form a pattern;

(D) reacting a silicon containing compound with the photoresist film pattern-exposed to silylate a light-exposed portion of the photoresist film, thereby making etching resistance of the light-exposed portion higher than a non-light-exposed portion of the photo-resist film, said silicon containing compound is an organic silicon compound having a hydrolysis group which generates an active silanol group by hydrolysis and a reactive organic group reactive to an amino group, a carboxyl group, and an alkoxycarbonyl group, and said organic silicon compound having an organic metal compound and improving hardness, wafer resistance, heat resistance, and mechanical strength of a silyl compound; and (E) performing reactive ion etching using a silylated photoresist film as a mask, thereby dry-developing the non-light-exposed portion of the photoresist film simultaneously with etching the organic insulating film.

2. The method according to claim 1, wherein said silicon containing compound in the step (D) is at least one selected from the group consisting of hexamethyldisilazane, tetramethyldisilazane, silane, disilane, dichlorsilane, silane trichloride, silicon tetrachloride, and silicon tetrafluoride.

3. A method of manufacturing a semiconductor device, comprising the steps of:

(A) forming an organic insulating film on a surface of a silicon wafer;

(B) forming a photoresist film on the organic insulating film;

(C) exposing the photoresist film to light to form a pattern;

(D) reacting a silicon containing compound with the photoresist film pattern-exposed to silylate a light-exposed portion of the photoresist film, thereby making etching resistance of the light-exposed portion higher than a non-light-exposed portion of the photo-resist film; and (E) performing reactive ion etching using a silylated photoresist film as a mask, thereby dry-developing the non-light-exposed portion of the photoresist film simultaneously etching the organic insulating film, and covering the pattern formation surface of the wafer with a wiring material.

4. The method according to claim 3, wherein the patterned photoresist film is not removed before the pattern formation surface is covered with the wiring material.

5. The method according to claim 4, further comprising a step of removing the patterned photoresist film together with an unnecessary wiring material by a chemical mechanical polishing (CMP) method after the step (E).

6. The method according to claim 3, wherein the patterned photoresist film is not removed and left on the wafer.

7. A method of manufacturing a semiconductor device comprising the steps of:

(a) forming an insulating film of a surface of a silicon wafer;

(b) forming a photoresist film on the insulating film;

(c) exposing the photoresist film to light to form a pattern;

(d) wet-developing the photoresist film pattern-exposed;

(e) implanting a dopant into the photoresist film, thereby improving etching resistance of the photoresist film; and (f) etching the insulating film by reactive ion etching using the photoresist film improved in etching resistance as a mask.

8. The method according to claim 7, wherein, in said step (b), a photoresist film of 10 to 30 nm thick is formed on the insulating film by a spin coater.

9. The method according to claim 7, wherein, in said step (e), P or As is implanted into the photoresist film as a dopant by an ion implanter.

10. The method according to claim 7, wherein, said step (e) is performed immediately after the light-exposure step (c).

11. The method according to claim 7, wherein said step (e) is performed immediately after the developing step (d).

12. The method according to claim 7, wherein said step (e) is performed immediately before the etching step (f).

13. The method according to claim 7, wherein a pattern formation surface of the wafer is covered with a wiring material after the etching step (f).

14. The method according to claim 13, wherein a patterned photoresist film is not removed before the pattern formation surface is covered with a wiring material.

15. The method according to claim 14, wherein the patterned photoresist film is removed together with an unnecessary wiring material by a chemical mechanical polishing (CMP) method.

16. The method according to claim 7, wherein the patterned photoresist film is not removed and left on the wafer.

* * * * *